US006250869B1

(12) United States Patent
Kroeker

(10) Patent No.: US 6,250,869 B1
(45) Date of Patent: *Jun. 26, 2001

(54) THREE CHAMBER LOAD LOCK APPARATUS

(75) Inventor: Tony R. Kroeker, Georgetown, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/350,790

(22) Filed: Jul. 9, 1999

Related U.S. Application Data

(62) Division of application No. 08/746,859, filed on Nov. 18, 1996, now Pat. No. 5,961,269.

(51) Int. Cl.[7] .................................................. B65G 49/00
(52) U.S. Cl. ........................................ 414/221; 414/217.1
(58) Field of Search ................................ 414/217, 217.1, 414/221, 222.09, 222.12, 226.03, 292, 331.14, 331.18, 939, 940

(56) References Cited

U.S. PATENT DOCUMENTS

| | | | |
|---|---|---|---|
| 3,090,593 | 5/1963 | Pro .......................................... 251/87 |
| 4,278,380 | * 7/1981 | Guarino ....................... 414/226.03 X |
| 4,514,129 | 4/1985 | Legille et al. ......................... 414/200 |
| 4,619,573 | * 10/1986 | Rathmann et al. ............. 414/331.14 |
| 4,632,624 | 12/1986 | Mirkovich et al. ................... 414/217 |
| 4,765,591 | * 8/1988 | Bodnar ................................. 251/330 |
| 4,785,962 | 11/1988 | Toshima ................................ 220/260 |
| 4,819,167 | 4/1989 | Cheng et al. .................... 364/167.01 |
| 4,962,726 | 10/1990 | Matsushita et al. ................. 118/719 |
| 5,019,233 | 5/1991 | Blake et al. ..................... 204/792.12 |
| 5,120,019 | 6/1992 | Davis, Jr. ............................. 251/193 |
| 5,121,705 | 6/1992 | Sugino ................................. 118/719 |
| 5,133,284 | 7/1992 | Thomas et al. ...................... 118/719 |
| 5,226,632 | 7/1993 | Tepman et al. .................... 251/335.3 |
| 5,275,303 | 1/1994 | Szalai ................................... 220/264 |

(List continued on next page.)

FOREIGN PATENT DOCUMENTS

| | | | |
|---|---|---|---|
| 62-252128 | * 11/1987 | (JP) .................................. 414/217.1 |
| 83100012 | 6/1994 | (TW) . |

OTHER PUBLICATIONS

Z. Shiller and S. Dubowsky, "Robot Path Planning with Obstacles, Actuator, Gripper, and Payload Constraints," International Journal of Robotics Research, vol. 8, No. 6, Dec. 1989, pp. 3–18.

Z. Shiller and H.H. Lu, "Computation of Path Constrained Time Optimal Motions With Dynamic Singularities," Transactions of the ASME, Journal of Dynamic Systems, Measurement, and Control, vol. 114, Mar. 1992, pp. 34–40.

Novellus Brochure.

Primary Examiner—James W. Keenan
(74) Attorney, Agent, or Firm—Thomas, Moser & Patterson, L.L.P.

(57) ABSTRACT

A functional load lock apparatus having two or more load lock chambers mounted on a central chamber which can be mounted on a single opening in a vacuum chamber such as a substrate processing platform for making integrated circuits on silicon wafers. Each load lock chamber preferably has a semi-cylindrical valve which remains sealed when the load lock chamber is open to atmospheric pressure. A wafer cassette holder positioned within each load lock chamber can be loaded and unloaded while the semi-cylindcical valves seal the vacuum chamber from atmospheric pressure. The semi-cylindrical valve pivots to an open position when the load lock chamber is under vacuum and the entire wafer cassette moves from the load lock chamber to the central chamber.

11 Claims, 10 Drawing Sheets

U.S. PATENT DOCUMENTS

| | | | |
|---|---|---|---|
| 5,292,393 | 3/1994 | Maydan et al. | 156/345 |
| 5,302,209 | 4/1994 | Maeda et al. | 118/719 |
| 5,363,872 | 11/1994 | Lorimer | 137/1 |
| 5,435,682 | 7/1995 | Crabb et al. | 414/217 |
| 5,469,035 | 11/1995 | Lowrance | 318/568.1 |
| 5,474,410 | 12/1995 | Ozawa et al. | 414/217 |
| 5,494,494 | 2/1996 | Mizuno et al. | 29/25.01 |
| 5,505,779 | 4/1996 | Mizuno et al. | 118/719 |
| 5,697,749 | 12/1997 | Iwabuchi et al. | 414/217 |
| 5,794,647 * | 8/1998 | Denmark et al. | 137/315 |
| 5,838,121 | 11/1998 | Fairbairn et al. | 318/45 |
| 5,844,195 | 12/1998 | Fairbairn et al. | 219/121.43 |
| 5,855,681 | 1/1999 | Maydan et al. | 118/719 |
| 5,902,088 | 5/1999 | Fairbairn et al. | 414/217 |
| 5,905,302 | 5/1999 | Lane et al. | 257/678 |
| 5,909,994 | 6/1999 | Blum et al. | 414/217 |
| 5,911,834 | 6/1999 | Fairbairn et al. | 134/1.3 |
| 5,984,150 * | 11/1999 | Scott | 414/217 X |
| 6,053,686 * | 4/2000 | Kyogoku | 414/939 X |
| 6,059,507 * | 5/2000 | Adams | 414/331.18 X |
| 6,062,798 * | 5/2000 | Muka | 414/939 X |
| 6,066,210 * | 5/2000 | Yonemitsu et al. | 414/939 X |

* cited by examiner

THREE CHAMBER LOAD LOCK APPARATUS

This is a continuation of application Ser. No. 08/746,859 filed on Nov. 18, 1996, now U.S. Pat. No. 5,961,269, issued Oct. 5, 1999.

BACKGROUND OF THE INVENTION

1. Field of the Invention

The present invention relates to loading and unloading of vacuum chambers while a vacuum is maintained in the chamber. More specifically, the invention relates to a load lock apparatus for loading silicon substrates in a substrate processing platform.

2. Background of the Related Art

Cluster tools which combine numerous substrate processing units in a processing platform have become generally accepted as an effective and efficient concept in advanced microelectronics manufacturing. A cluster tool generally refers to a modular, multi-chamber, integrated processing system. It typically consists of a central wafer handling vacuum chamber and a number of peripheral vacuum process chambers. The silicon wafers go through a set of process steps under vacuum in the various process stations without being exposed to ambient conditions. The transfer of the wafers for the processes is managed by the wafer handling vacuum chamber which is also maintained under vacuum conditions. Cluster tools offer significantly higher yields on account of lower defect densities. Different types of cluster tools, such as linear or radial, with different types of architecture are possible.

Substrate processing platforms typically include at least two load lock chambers mounted on separate openings in the central wafer handling vacuum chamber for loading or unloading silicon wafers while the vacuum chamber remains under vacuum. The load lock chambers occupy valuable positions on the processing platform which would otherwise be used for additional process chambers. However, two chambers are usually required to maintain continuous operation such that wafers are processed from one load lock chamber while finished wafers are unloaded from the other chamber and new wafers are loaded.

FIG. 1 (prior art) shows a commercially available substrate processing platform offered by Applied Materials, Inc. under the trademark Endura®. The platform combines vacuum chambers designed to process silicon wafers at low/high pressure vacuum in the range of $10^{-3}$ to $10^{-8}$ torr.

Referring to FIG. 1, silicon wafers in a cassette 10 are introduced and withdrawn from the platform 52 through a first slit valve by a first load lock chamber 12 or through a second slit valve by a second load lock chamber 14. A fist robot 16 having a blade 18 is located in a buffer chamber 20 to move a wafer 22 between various chambers 24, 26, 28 surrounding the buffer chamber 20. A second robot 30 is located in a transfer chamber 32 to transfer a wafer 34 between various chambers 28, 36 surrounding the transfer chamber 32. The buffer chamber 20 and the transfer chamber 32 are connected through two common chambers 28. It is understood in the art that a wafer may be processed or cooled in one or more chambers for any number of times in any order to accomplish fabrication of a desired semiconductor structure on the wafer. A microprocessor controller 38 and associated software is provided to control processing and movement of wafers.

Attempts to connect two or more load lock chambers to a single slit valve in a processing platform have been unsuccessful. Such an apparatus must have internal valves large enough for the transfer of entire cassettes of wafers. Large valves are difficult to seal when the load lock chamber is open to the atmosphere and is mounted on a chamber that is under high vacuum.

It is an objective of the present invention to provide a load lock apparatus for mounting two load lock chambers on a single slit valve in a substrate processing platform. It is a further objective of this invention to provide a large valve in a load lock chamber which will remain sealed when the load lock chamber is mounted on an opening in a vacuum chamber under high vacuum conditions.

SUMMARY OF THE INVENTION

The present invention provides a functional load lock apparatus having two or more load lock chambers mounted on a central chamber which can be mounted on a single opening in a vacuum chamber such as a substrate processing platform for making integrated circuits on silicon wafers.

The present invention also provides a load lock apparatus having a semi-cylindrical valve mounted in a load lock chamber. The semi-cylindrical valve remains sealed when the load lock chamber is open to atmospheric pressure. A wafer cassette holder positioned within each load lock chamber can be loaded and unloaded while the semi-cylindrical valves seal the vacuum chambers from atmospheric pressure. The semi-cylindrical valve pivots to an open position when the load lock chamber is under vacuum and the entire wafer cassette moves from the load lock chamber to the central chamber.

BRIEF DESCRIPTION OF THE DRAWINGS

So that the above recited features, advantages and objects of the present invention can be understood in detail, a more particular description of the invention, briefly summarized above, may be had by reference to the embodiments thereof which are illustrated in the appended drawings.

The appended drawings illustrate typical embodiments of this invention and are not to be considered limiting of its scope, for the invention may admit to other equally effective embodiments.

DETAILED DESCRIPTION OF THE INVENTION

Figure 1:
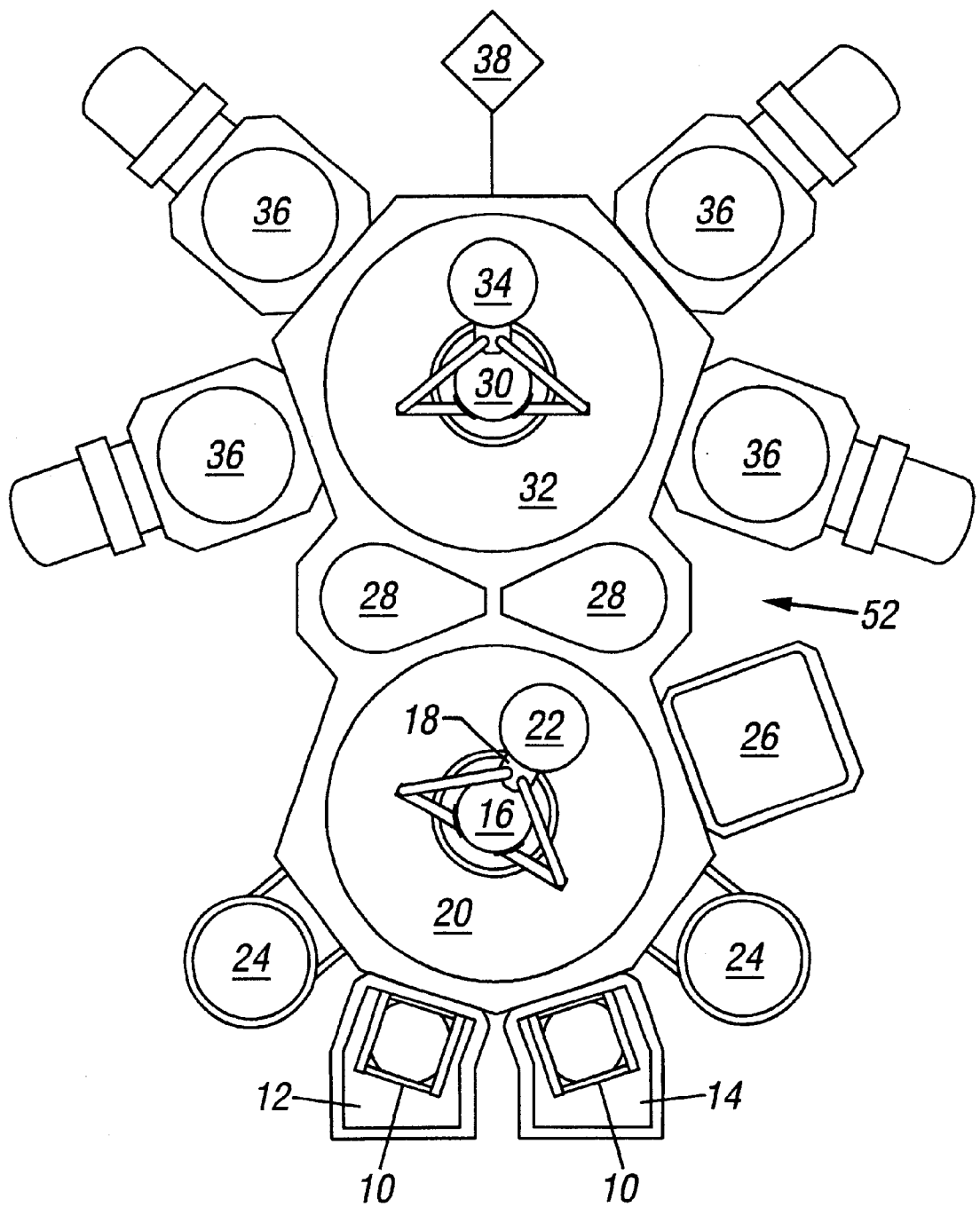
FIG. 1 (prior art) is a top schematic view of a radial cluster tool for batch processing of silicon wafers.

The present invention generally provides a load lock chamber having a two or more isolatable regions selectively communicable with a central transfer region. The load lock chamber is preferably mounted on a vacuum system so that the central transfer region is selectively communicable with the vacuum system. Each load lock region defines a loading port disposed in a sidewall and includes a door valve mounted in the loading port and a transfer port selectively communicable with the transfer region. A valve is rotatably disposed in each region to selectively communicate each load lock region with the transfer region. The central housing of the loadlock chamber preferably includes a transfer port which is selectively communicable with the vacuum system and a port selectively communicable with each load lock region so that wafers can be moved from each load lock region into the transfer region and then into the vacuum system.

In one embodiment of the present invention, a sealing valve is disposed in each load lock region to selectively communicate the load lock region and the transfer region. Preferably, the valve is a semi-cylindrical valve rotatably disposed in the load lock region. A wafer cassette holder is mounted on a shaft which is movably disposed in each load lock region to move the wafer cassette into the transfer region. An elevator mechanism, such as a stepper motor, moves the cassette holder within the load lock region to transfer the wafer cassette holder between the load lock region and the central transfer region. In one embodiment, at least two load lock housings are mounted on a central housing to eliminate the need for a second load lock chamber mounted on a separate opening in the vacuum chamber.

The load lock chamber of the present invention is preferably operated by a microprocessor controller provided with the vacuum system. The sequence and timing of operating the load lock chamber is provided so that a first load lock region is loaded and pumped down to a selected pressure so that a wafer cassette can be moved into the transfer region and wafers moved into the vacuum system. While the wafers are being processed, the second load lock region is loaded and pumped down to the desired pressure. After the wafers moved from the first region are processed, the wafer cassette is moved back into the load lock region and the valve disposed between the transfer region and the load lock region is closed. The wafer cassette in the second load lock region is then moved into the transfer region and the wafers loaded into the system.

A preferred load lock apparatus for mounting on a vacuum system having two or more load lock chambers which have semi-cylindrical valves disposed in the ports located between the load lock chambers and are the central transfer chamber will be described in references to FIGS. 2–15. The various chamber components are preferably machined from aluminum, but may be comprised of any other material known in the art and compatible with vacuum processing.

Figure 2:
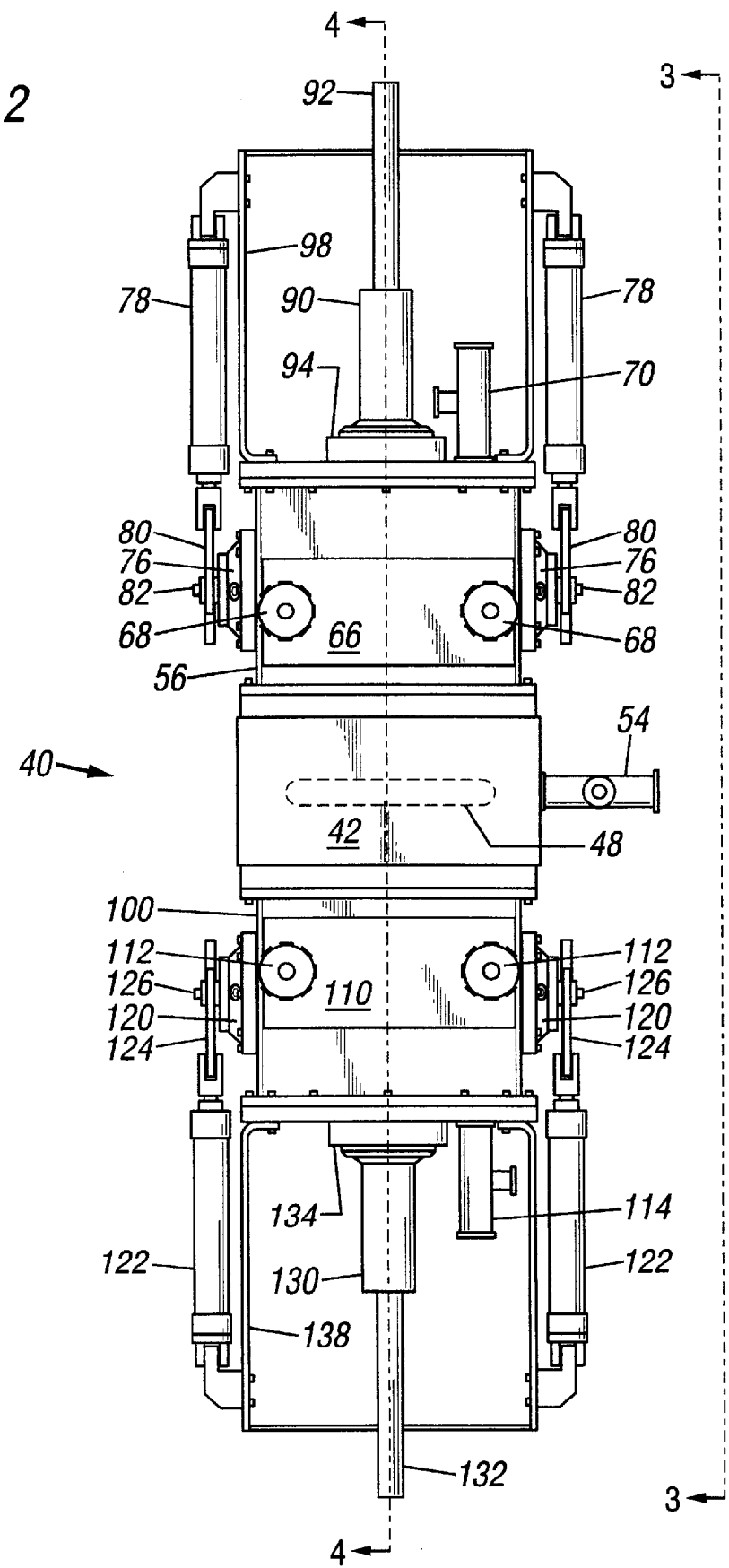
FIG. 2 is a front schematic view of a load lock apparatus of the present invention comprising two load lock chambers for mounting to a slit valve in a substrate processing platform such as the radial cluster tool of FIG. 1.

FIG. 2 is a front view of a preferred load lock apparatus of the present invention comprising two load lock chambers for mounting to a slit valve in a substrate processing platform such as the radial cluster tool of FIG. 1. The load lock chambers are preferably vertically aligned around a central chamber to make room for processing chambers on adjacent slit valves. Referring to FIG. 2, the load lock apparatus 40 comprises a central housing 42 having a slit 48 for mounting adjacent a slit valve on a processing platform The slit 48 will usually have a width corresponding to passage of a silicon wafer. However, the use of double wide slits for passage of two wafers side-by-side is also contemplated. Each substrate cassette holder 60, 104 (shown in FIG. 5) may support two substrates in a side-by-side relationship. The central housing 42 has a vacuum port 54 for connection to a vacuum system commonly provided with the processing platform 52 or optionally provided with the load lock apparatus.

The load lock apparatus further comprises a first load lock housing 56 mounted on the central housing 42. A door valve 66 having external knobs 68 which engage the first load lock housing 56 provide access for loading and unloading wafers as described for FIG. 5 below. Preferably, the door valve 66 is operated automatically by the processing platform. Automatic door valves are used commercially on the load lock chambers of FIG. 1 and can be included on the present invention. A vacuum port 70 on the first load lock housing 56 connects to a vacuum system commonly provided with the processing platform 52 or optionally provided with the load lock apparatus. The vacuum system typically can achieve pressures lower than 0.01 Torr in a load lock chamber.

Rotatable seals 76 are mounted in both sides of the load lock housing 56 and pivot pins 82 are rotatably mounted in the rotatable seals 76. Pneumatic actuating arms 78 are externally fastened at one end to the load lock housing 56 and the other ends are pivotally linked to pivot arms 80 which are fastened to the pivot pins 82. External components of a first cassette elevator 90 are protected by a shield 98 which is mounted on the load lock housing 56 and also secures an end of the pneumatic actuating arms 78. Expansion or contraction of the pneumatic actuating arms 78 rotates the pivot pins 82 and operates internal components as described for FIG. 4 below.

Figure 5:
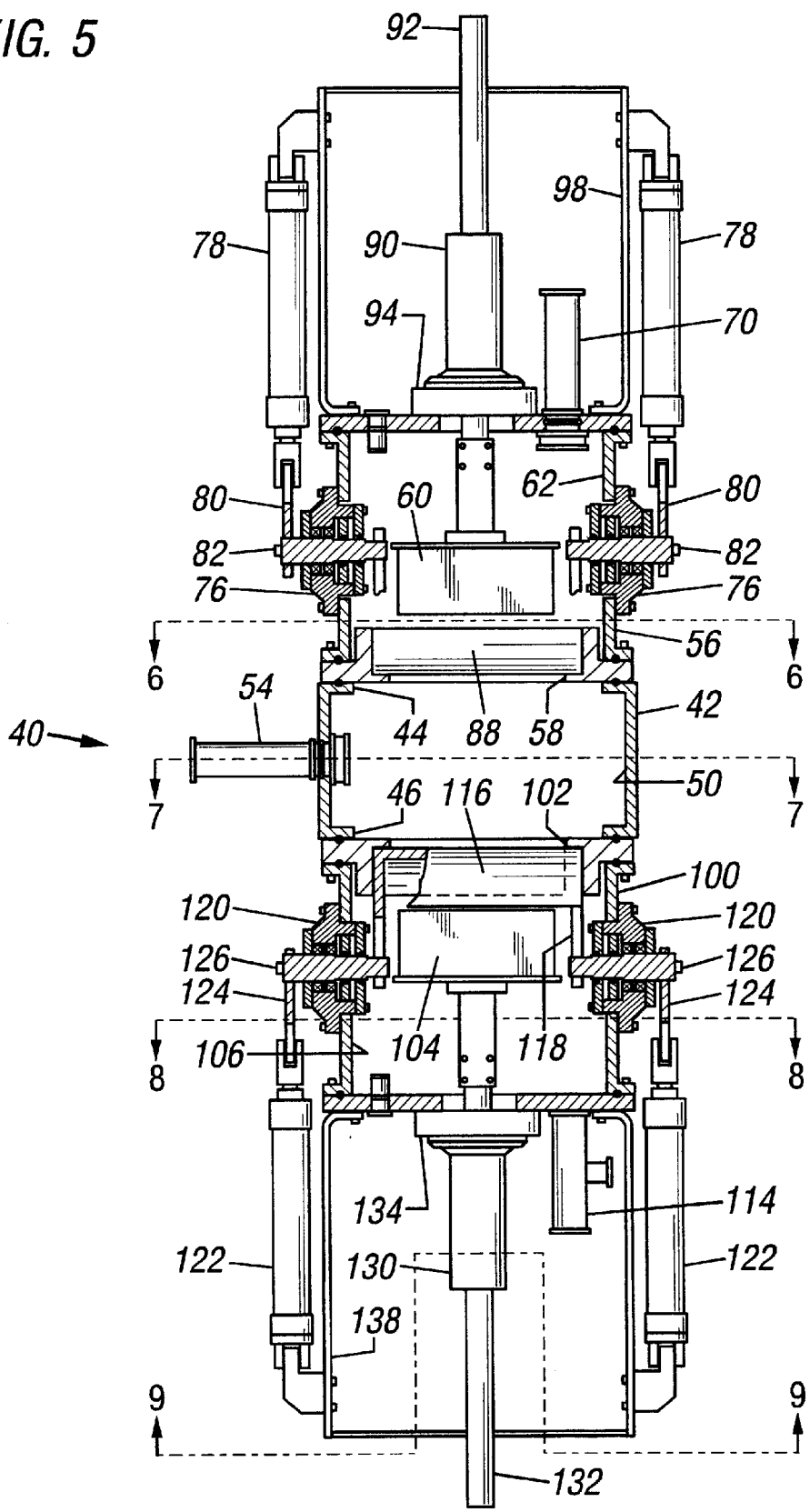
FIG. 5 is a rear sectional view of the load lock apparatus of FIG. 2 showing the internal semi-cylindrical valve and wafer cassettes.

The first cassette elevator 90 moves a cassette of wafers within the apparatus as described for FIG. 5 and externally includes a shaft 92 which slides through a packing gland 94 mounted on the load lock housing 56.

The load lock apparatus 40 further comprises a second load lock housing 100 mounted on the central housing 42. A door valve 110 having knobs 112 which engage the second load lock housing 100 provide access for loading and unloading wafers as described for FIG. 5 below. Preferably, the door valve 110 is operated automatically by the processing platform 52 as described above. A vacuum port 114 on the second load lock housing 100 connects to a vacuum system as described for the vacuum port 70 on the first load lock housing 56.

The load lock apparatus further comprises rotatable seals 120 and pivot pins 126 on the second load lock housing 100 as described for the first load lock housing 56. Pneumatic actuating arms 122 are fastened to the load lock housing 100 at one end and the other ends are linked to pivot arms 124 which are fastened to the pivot pins 126. External components of a second cassette elevator 130 are protected by a shield 138 which is mounted on the load lock housing 100 and also secures an end of the pneumatic actuating arms 122. Expansion or contraction of the pneumatic actuating arms 122 rotates the pivot pins 126 and operates internal components described for FIG. 4 below.

The second cassette elevator 130 moves a second cassette of wafers within the apparatus as described for FIG. 5 and externally includes a shaft 132 which slides through a packing gland 134 mounted on the second load lock housing 100.

Figure 3:
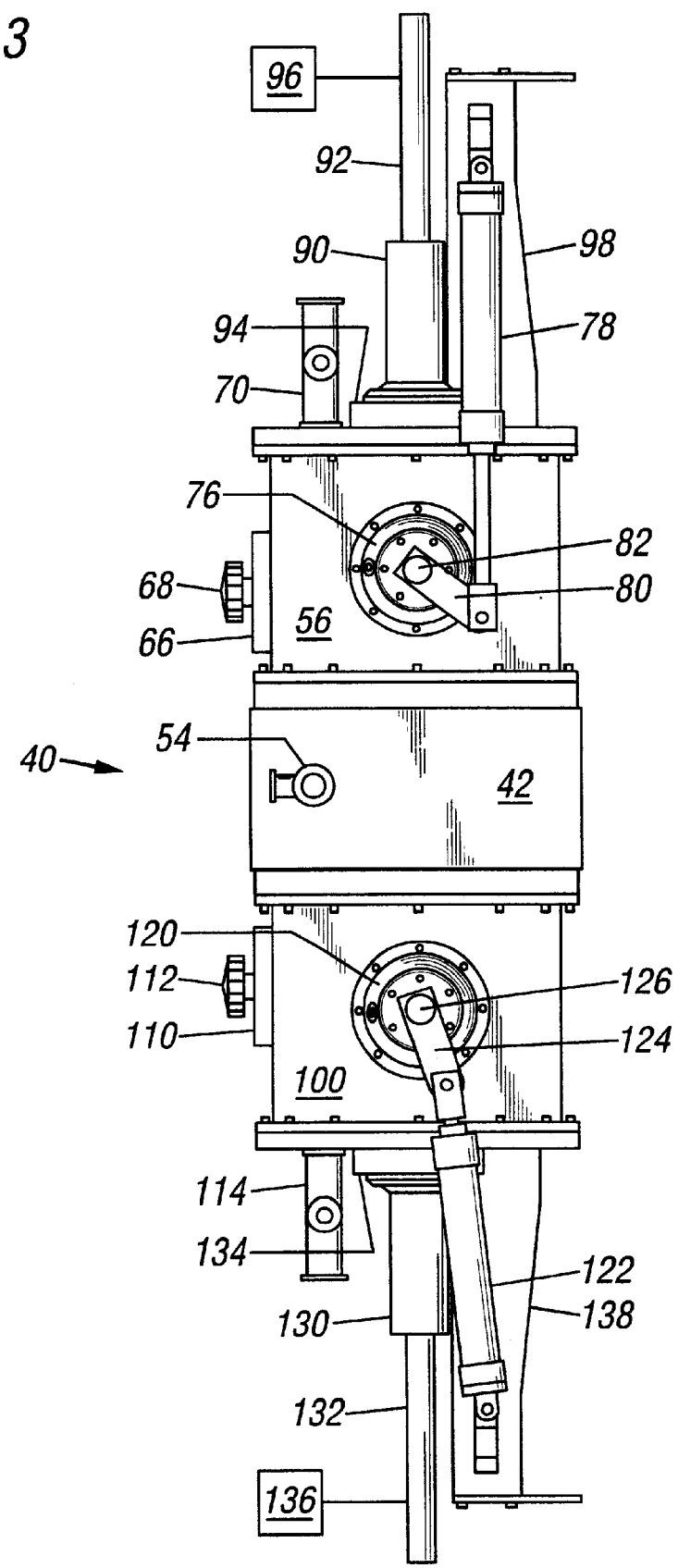
FIG. 3 is a side schematic view of the load lock apparatus of FIG. 2.

FIG. 3 is a side view of the load lock apparatus of FIG. 2 and shows the first pneumatic arms 78 in an extended position for comparison to a retracted position shown for the second pneumatic arms 122.

Figure 4:
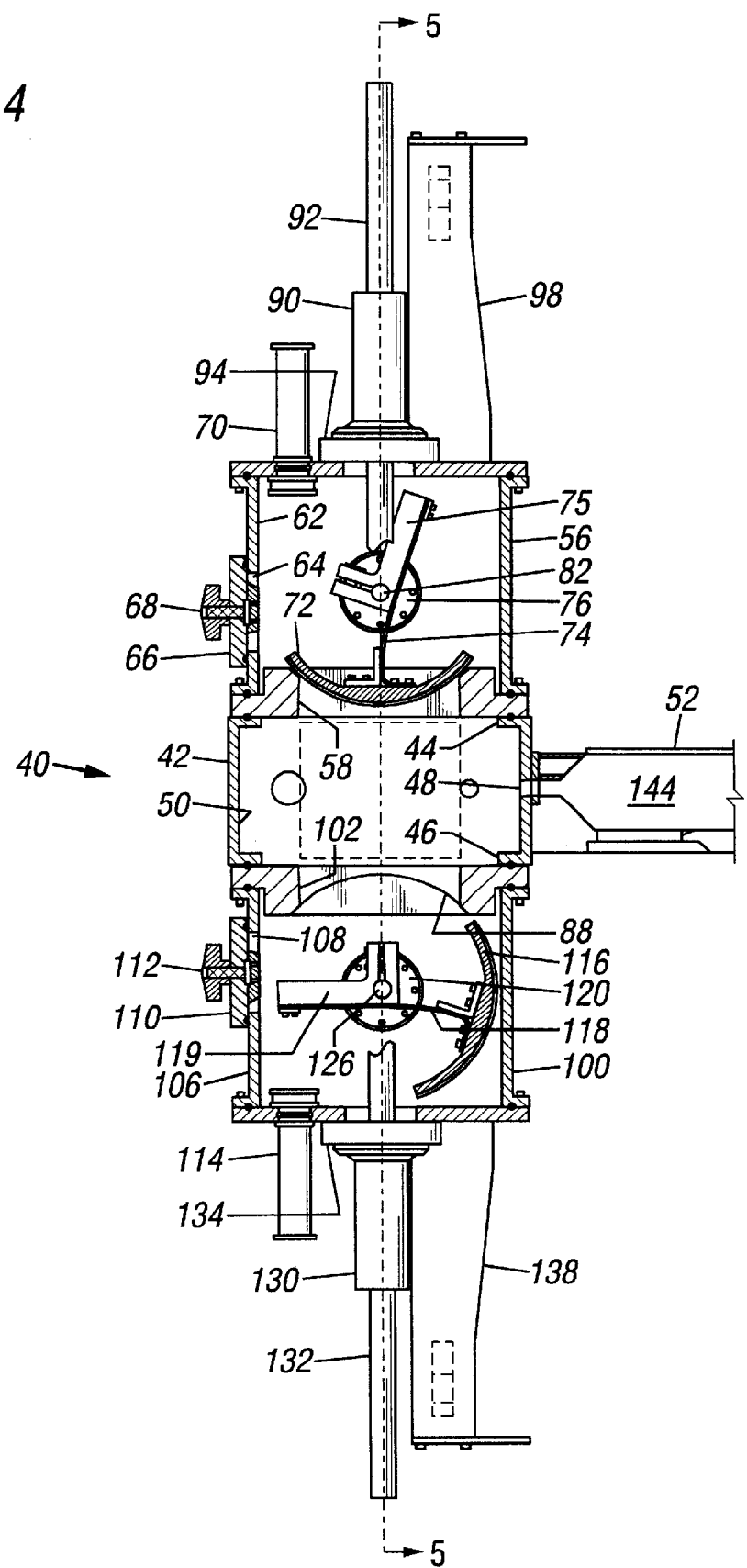
FIG. 4 is a side sectional view of the load lock apparatus of FIG. 2 showing internal semi-cylindrical valves.

FIG. 4 is a side sectional view of the load lock apparatus of FIG. 2 showing internal chambers and semi-cylindrical valves. The central housing 42 internally comprising first 44 and second 46 openings and the slit 48 for transferring substrates between a central chamber 50 within is the central housing and the processing platform 52. The first load lock housing 56 internally comprising a first opening 58 adjacent the first opening 44 of the central housing 42 for transferring a first substrate cassette holder 60 (FIG. 5) between the central chamber 50 and a first load lock chamber 62 within the first load lock housing 56. The first load lock housing 56 further comprises a second opening 64 for loading or unloading the first substrate cassette holder 60 through the door valve 66.

The load lock apparatus 40 internally comprises a first semi-cylindrical valve 72 pivotally mounted to the first load lock housing 56. The semi-cylindrical valve 72 is fastened by screws or the like at each side to flexible brackets 74 which are fastened to eccentric supports 75. Each eccentric support 75 is fastened to one of the pivot pins 82 which pass through the load lock housing 56 as described for FIG. 2. Expansion or contraction of the pneumatic actuating arms 78 rotates the eccentric supports 75 and moves the semi-cylindrical valve 72 between an open position and a closed position to selectively communicate the first load lock chamber 62 and the central chamber 50. Connection of the semi-cylindrical valve 72 to the load lock housing 56 can be achieved in a variety of ways. The flexible brackets 74, eccentric supports 75, and rotatable seals 76 shown in FIG. 4 minimize vacuum leaks while m m g wear of internal valve components in the load lock chamber 62.

The second load lock housing 100 internally comprises a first opening 102 adjacent the second opening 46 of the central housing 42 for transferring a second substrate cassette holder (FIG. 5) between the central chamber 50 and a second load lock chamber 106 within the second load lock housing 100. The second load lock housing 100 further comprises a second opening 108 for loading or unloading the second substrate cassette holder 104 through the door valve 110.

The load lock apparatus further comprises a second semi-cylindrical valve 116 pivotally mounted to the second load lock housing 100 by flexible brackets 118, eccentric supports 119, pivot pins 126, and rotatable seals 120 as described for the first semi-cylindrical valve 72. The semi-cylindrical valve 116 has the same valve stops 83 and the same movement (FIGS. 10–12) described for the first semi-cylindrical valve 72.

FIG. 5 is a rear sectional view of the load lock apparatus of FIG. 2 showing the internal semi-cylindrical valves and wafer cassettes. The first semi-cylindrical valve 72 is removed from the drawing to show a semi-cylindrical surface 88 on the first load lock housing 56 for seating the first semi-cylindrical valve. The load lock apparatus 40 further comprises the first cassette elevator 90 mounted to the first substrate cassette holder 60 for moving the first substrate cassette holder between the first load lock chamber 62 and the central chamber 50. The first cassette elevator 90 can be any means for moving the cassette holder 60 such as the shaft 92 which slides through the packing gland 94 mounted on the load lock housing 56. Preferably, the shaft 92 engages a screw drive system 96 FIG. 3) which aligns the cassette holder 60 with the slit 48 in the central chamber 50.

The load lock apparatus 40 further comprises the second cassette elevator 130 mounted to the second substrate cassette holder 104 for moving the second substrate cassette holder between the second load lock chamber 106 and the central chamber 50. The second cassette elevator 130 can be any means for moving the cassette holder 104 such as the shaft 132 which slides through the packing gland 134 mounted on the load lock housing 100. Preferably, the shaft 132 engages a screw drive system 136 (FIG. 3).

Each substrate cassette holder 60, 104 may have individual slits for receiving wafers or optionally may house an external wafer cassette which slips into the substrate cassette holder to accelerate loading and unloading. Each cassette elevator 90, 130 is vertically indexable so that every substrate in each substrate cassette holder 60, 104 can be delivered by the first robot 140 through the slit 48 in the central housing 42. For example, computer-controlled, stepper motor-driven lead screw drive systems 96, 136 may be used to position the substrate cassette holders 60, 104 for loading and unloading wafers through the door valves 66, 112 in each load lock housing 42, 100 and for loading and unloading wafers through the slit 48 in the central housing 42. The screw drive systems are currently used to perform the same function on the commercially available platform of FIG. 1.

Figure 6:
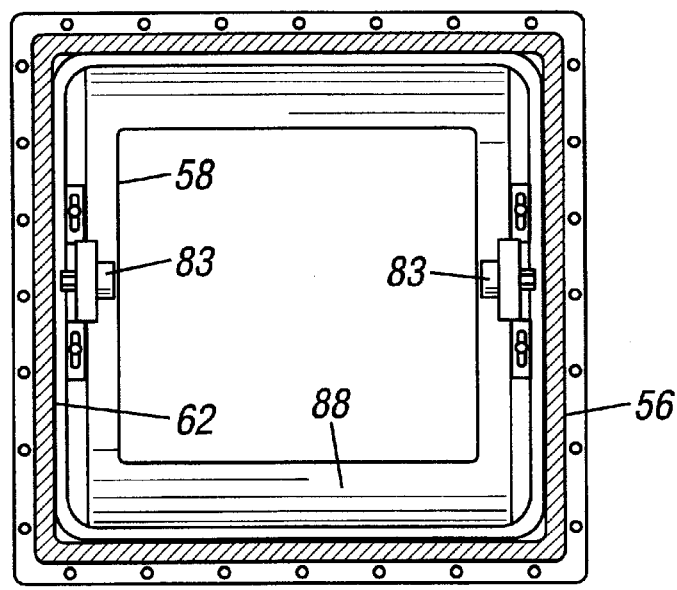
FIGS. 6–9 are top sectional views of the load lock apparatus of FIG. 2.
Figure 7:
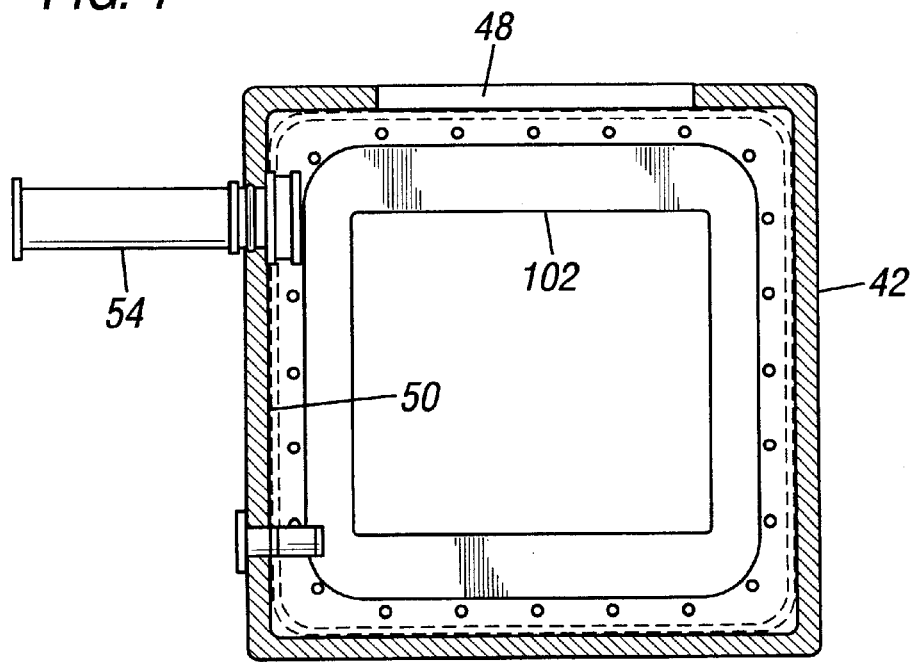
Figure 8:
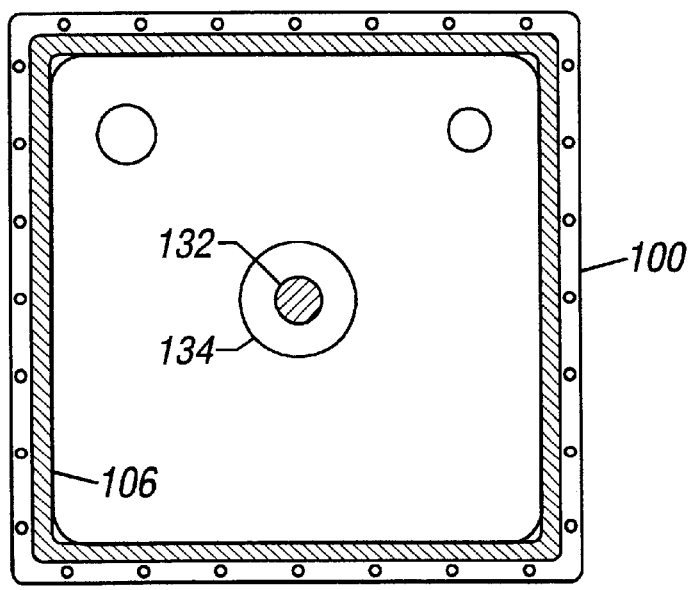
Figure 9:
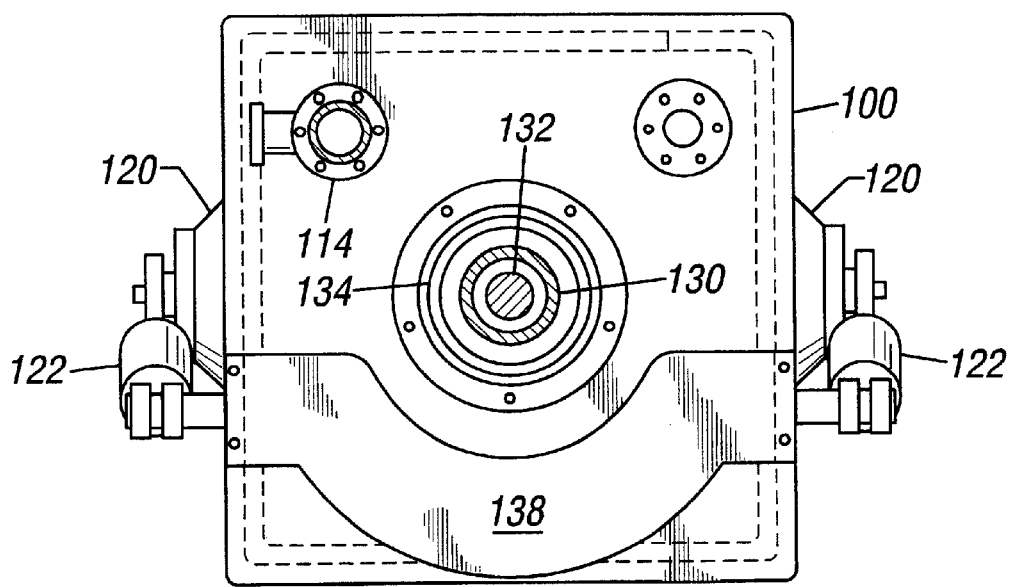

FIGS. 6–9 show horizontal cross-sections through chambers inside the load lock apparatus as indicated in FIG. 5. FIG. 6 shows a cross-section through the first load lock chamber 62 looking toward the semi-cylindrical surface 88 on the first load lock housing 56. The view also shows the first opening 58 in the first load lock housing 56 and the valve stops 83. FIG. 7 show a cross-section through the central chamber 50 looking toward the first opening 102 in the second load lock housing 42. FIG. 8 is a cross-section through the second load lock chamber 106 and the shaft 132 which mounts the second substrate holder 104. FIG. 9 is a cross-section through the shaft 132 looking toward the packing gland 134 outside the second load lock housing 100.

Figure 10:
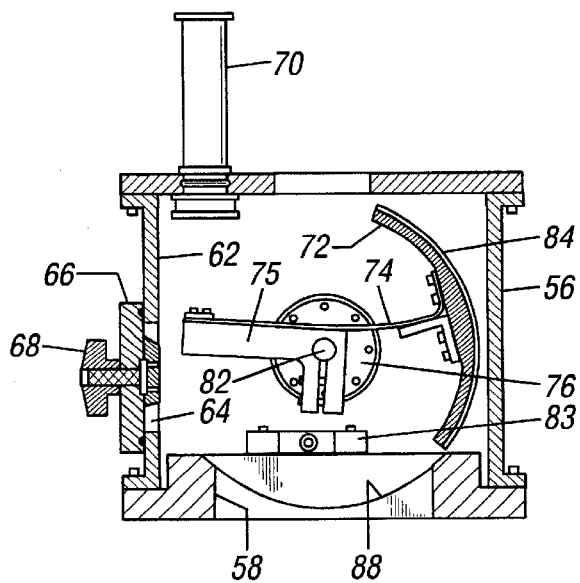
FIGS. 10–12 are sectional views of a load lock chamber of the load lock apparatus of FIG. 2 showing movement of the semi-cylindrical valve.
Figure 11:
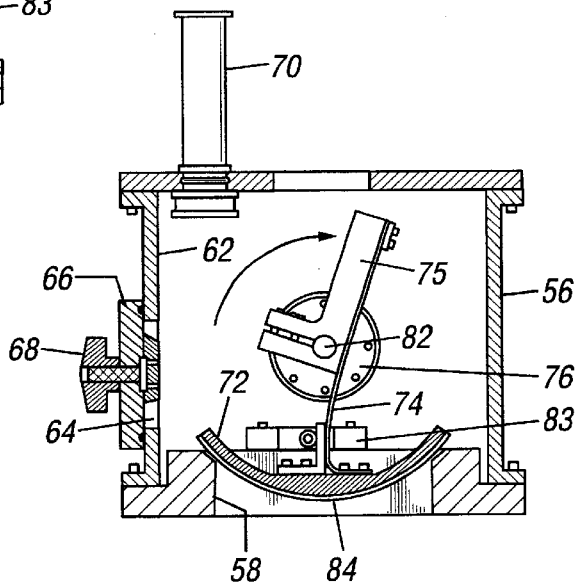
Figure 12:
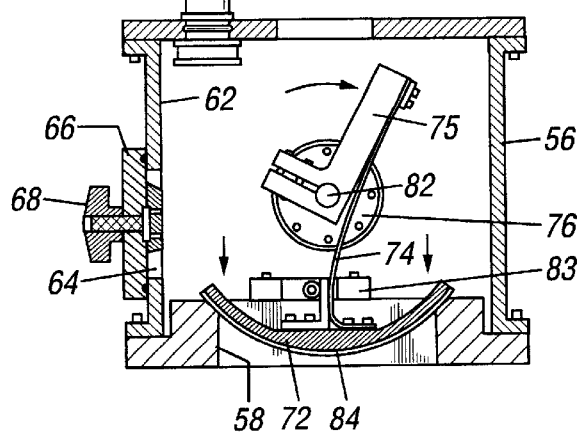

FIGS. 10–12 show the movement of the first semi-cylindrical valve 72. Rotation of the pivot pins 82 also rotates the eccentric supports 75 which mount the flexible brackets 74 and the semi-cylindrical valve 72. Initial rotation of the pivot pins 42 moves the semi-cylindrical valve 72 from an open position, FIG. 10, to a closed position, FIG. 11, wherein the flexible brackets 74 are blocked by the valve stops 83. Further rotation of the pivot pins 82 causes the flexible brackets 74 to flex away from the eccentric supports 75 and push the semi-cylindrical valve 72 outward to contact the semi-cylindrical surface 88 on the load lock housing 56. Venting of the load lock chamber 62 to atmospheric pressure pushes the semi-cylindrical valve 72 tighter toward the semi-cylindrical surface 88. Thus, the high pressure differential between the load lock chamber 62 and the central chamber 50 during wafer loading and unloading makes a tighter seal around the semi-cylindrical valve 72 and assists in sealing the central chamber 50. The semi-cylindrical valve 72 is not moved while a pressure differential exists between the central chamber 50 and the load lock chamber 62. The semi-cylindrical valve 72 is opened after the load lock chamber 62 is evacuated to about the same vacuum as the central chamber 50. Retraction of the pneumatic arms 78 opens the semi-cylindrical valve 72 by pulling the semi-cylindrical valve 72 away from the semi-cylindrical surface 88 on the load lock housing 56.

Figure 13:
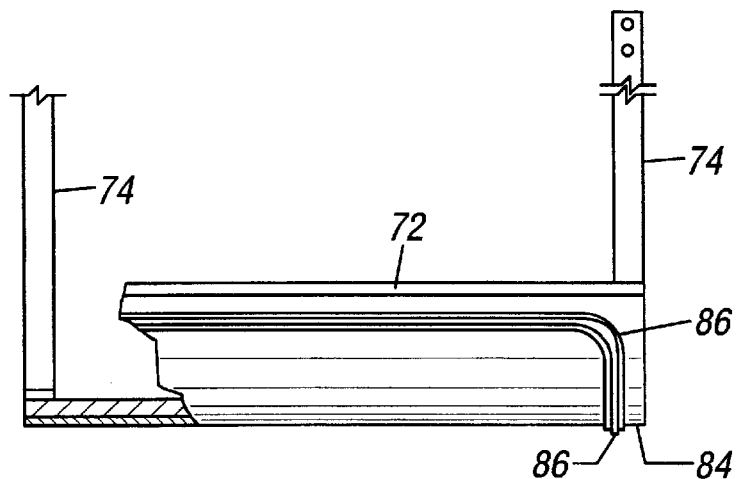
FIGS. 13–15 are detail views of the semi-cylindrical valves including separate valve seals.
Figure 14:
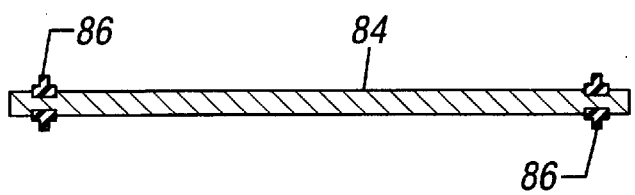
Figure 15:
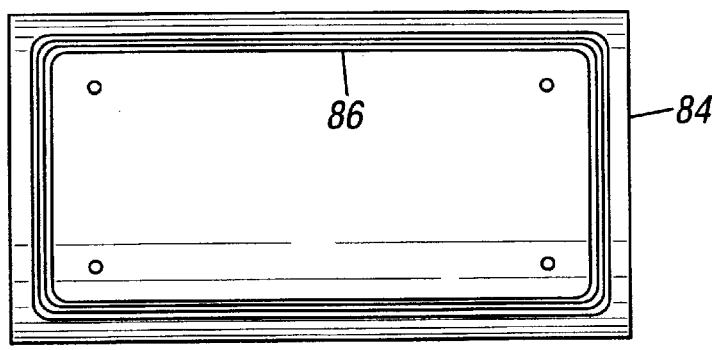

FIGS. 13–15 are detail views of the semi-cylindrical valves showing detachable valve seals which can be replaced when worn. FIG. 13 is a partial section view of the semi-cylindrical valve 72 showing the flexible brackets 74 supporting each end of the semi-cylindrical valve. The semi-cylindrical valve 72 preferably has a detachable seal 84 which is formed by machining channels in both sides of a flat aluminum sheet and rolling the sheet to the desired shape. Durable elastomer seals 86, such as VITON fluoroelastomer (a trademark of du Pont), are adhered to the channels in the detachable seal 84. The outer elastomer seal 86 rests against the semi-cylindrical surface 88 around the first opening 58 in the first load lock housing 56. The inner elastomer seal 86 is preferably the same as the outer seal, but could be an 0-ring which is not adhered to the channel in the detachable seal 84. FIG. 14 is a cross-section through the detachable seal 84 and elastomer seals 86. FIG. 15 is a plane view of the detachable seal 84 showing that the elastomer seal 86 is positioned near the perimeter of the detachable seal 84.

Figure 16:
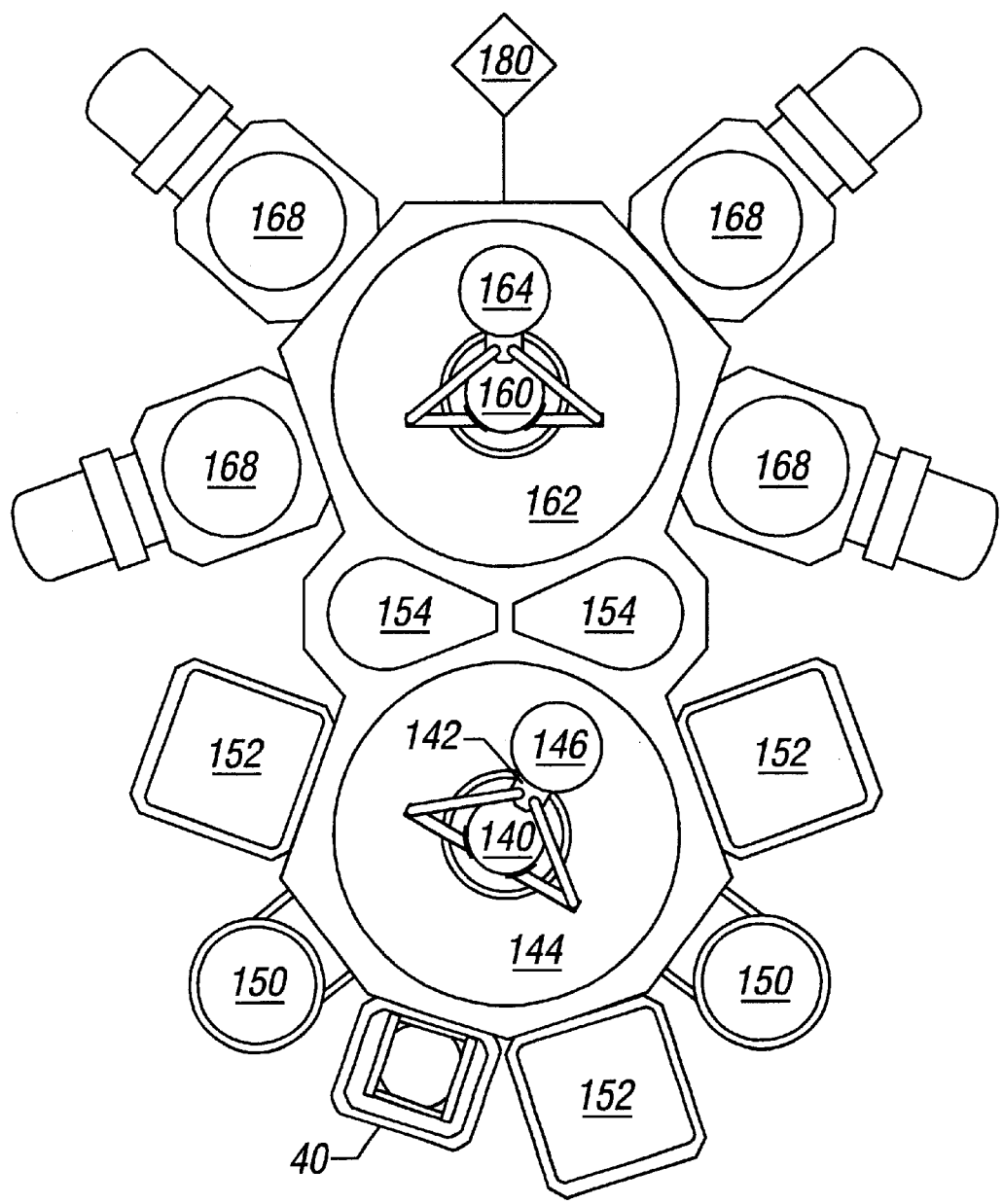
FIG. 16 is a top schematic view of the load lock apparatus of FIG. 2 replacing both of the load lock chambers on the cluster tool of FIG. 1.

FIG. 16 shows the load lock apparatus 40 of the present invention mounted on the commercially available substrate processing platform 52 of FIG. 1. A first robot 140 having a blade 142 is located in a buffer chamber 144 to move a wafer 146 between various chambers 150, 152, 154 surrounding the buffer chamber 144. A second robot 160 is located in a transfer chamber 162 to transfer a wafer 164 between various chambers 154, 166 surrounding the transfer chamber 162. The buffer chamber 144 and the transfer chamber 162 are connected through two cooling chambers 154. It is understood in the art that a wafer may be processed or cooled in one or more chambers for any number of times in any order to accomplish fabrication of a desired semiconductor structure on the wafer. A microprocessor controller 180 and associated software controls movement and processing of wafers throughout the system.

Alternative means for connecting the semi-cylindrical valves 72, 116 to the first and second load lock housings 56, 100 include rigid brackets that are fastened to the semi-cylindrical valves and to the pivot pins 82, 126 without the eccentric supports 75, 119. Pushing or pulling the semi-cylindrical valves with respect to the semi-cylindrical surfaces 88 on the load lock housings 56, 100 can be accomplished with a rigid bracket by eccentrically mounting the pivot pins 82, 126 in the rotatable seals 76, 120 and fastening external levers to the rotatable seals. When the cylinder valves are in a closed position, the external levers are separately actuated to rotate the seals and shift the pivot pins toward the semi-cylindrical surfaces 88. As another alternative, the flexible brackets 74, 118 could be replaced by hinged brackets that are spring biased in a retracted position when the valves are open. Rotation of the hinged brackets will also be blocked by the valve stops 83 and continued rotation of the pivot pins 82, 126 will straighten the hinged bracket and push the semi-cylindrical valve against the semi-cylindrical surface 88.

Operation of the load lock apparatus 40 is very similar to operation of two separate load lock chambers 12, 14 after the load lock apparatus 40 has been mounted on the substrate processing platform 52. The central chamber 50 is preferably connected by vacuum port 54 to the vacuum source provided with the platform 72. The vacuum port 54 is used to evacuate the central chamber 50 in the load lock apparatus 40, but may be used to evacuate the entire buffer chamber 144 in the platform 72. The central chamber 50 will typically be purged with dry nitrogen to remove moisture and evacuated to a pressure below 0.01 Torr while both semi-cylindrical valves 72, 116 are closed. The load lock chambers 62, 106 are also purged with dry nitrogen while the central chamber 50 is purged and evacuate& The central chamber 50 is generally maintained at the same conditions as the buffer chamber 144 during all process steps.

After the central chamber 50 is evacuated, the semi-cylindrical valves 72, 116 tightly seal the central chamber 50 and purging of the first load lock chamber 62 can continue while wafers are loaded in the first substrate cassette holder 60. The first door valve 66 is then closed and the first load lock chamber 62 is evacuated through vacuum port 70 to a pressure less than 0.01 Torr. The first semi-cylindrical valve 72 is then opened and the first cassette mover 90 moves the first substrate cassette holder 60 into the central chamber 50.

While wafers in the first substrate cassette holder 60 are being processed in the platform 52, the wafer loading procedure is repeated for the second substrate cassette holder 108 in the second load lock chamber 106. After all wafers in the first substrate cassette holder 60 have been returned from the platform 52, the first cassette holder 60 is returned to the first load lock chamber 62, the first semi-cylindrical valve 72 is closed, and the first load lock chamber 62 may be vented and purged with a gas such as dry nitrogen. The second door valve 110 is then closed and the second load lock chamber 106 is evacuated through vacuum port 114 to a pressure below 0.01 Torr. Wafers in the second substrate cassette holder 104 are then moved into the central chamber 50 and processed in the platform 52 while processed wafers are removed from the first cassette holder 60.

Operation of the platform 52 continues until all wafers in the second substrate cassette holder 104 are processed and returned to the cassette holder 104. The second cassette holder 104 is returned to the second load lock chamber 106 and the second semi-cylindrical valve 116 is closed. The second load lock chamber 106 may then be vented and purged with a gas such as dry nitrogen prior to unloading the processed wafers and loading new wafers.

Loading and unloading of wafers through the door valves 66, 110 typically takes place in a controlled clean room using robots which minimize contamination of the wafers. The load lock 25 apparatus 40 is preferably controlled by the microprocessor controller 180 which controls the substrate processing platform 52 as well as other components in the clean room. The load lock apparatus 40 preferably has the same input/output devices used for the available load lock chambers 12, 14 and can thus replace the available chambers 12, 14 with little or no modification of the microprocessor controller 38 or associated software. Of course, an existing substrate processing platform can be modified or a new substrate processing platform can be designed, by persons skilled in the art, to include a load lock apparatus of the present invention using the preceding disclosure.

While the foregoing is directed to the preferred embodiment of the present invention, other and further embodiments of the invention may be devised without departing from the basic scope thereof The scope of the invention is determined by the claims which follow.

What is claimed is:

1. A load lock apparatus, comprising:
   a central housing having a wall defining an opening for the passage of a substrate there through connecting the central housing and a substrate processing platform;
   two or more load lock housings connected to the central housing, wherein a first load lock housing is disposed on an upper surface of the central housing and a second load lock housing is disposed on a lower surface of the central housing;
   a load lock valve disposed between each load lock housing and the central housing; and two or more substrate cassette holders, each cassette holder being connected to a cassette mover, each mover being adapted to transfer each respective cassette holder between the central housing and one of the load lock housings.

2. The apparatus of claim 1, wherein each load lock housing comprises a door valve.

3. The apparatus of claim 2, wherein each load lock valve is disposed adjacent an opening between each respective load lock housing and the central housing.

4. The apparatus of claim 3, herein a first load lock valve isolates a first space in the first load lock housing from the central housing and a second load lock valve isolates a second space in the second load lock housing from the central housing.

5. The apparatus of claim 1, wherein each load lock valve comprises a removable valve seal.

6. The apparatus of claim 1 wherein the two or more substrate cassette holders are configured to receive multiple substrates.

7. A load lock apparatus, comprising:

a central housing having a wall defining an opening for the passage of a substrate there through connecting the central housing and a substrate processing platform;

two or more load lock housings disposed vertically on opposing sides of the central housing, wherein a first load lock housing is disused on an upper surface of the central housing and a second load lock housing is disposed on a lower surface of the central housing; and a load lock valve disposed between each load lock housing and the central housing.

8. The apparatus of claim 7, wherein each load lock valve is disposed adjacent an opening between each respective load lock housing and the central housing.

9. The apparatus of claim 7, wherein each load lock valve comprises a semi-cylindrical valve.

10. The apparatus of claim 7, further comprising:

a substrate cassette holder in each load lock housing collected to a cassette mover and disposable in each load lock housing.

11. A load lock apparatus, comprising:

a central housing having a wall defining an opening for the passage of a substrate there through connecting the central housing and a substrate processing platform;

two or more load lock housings connected to the central housing;

a semi-cylindrical valve pivotally mounted between each load lock housing and the central housing; and two or more substrate cassette holders, each cassette holder being connected to a cassette mover, the mover being adapted to transfer each respective cassette holder between the central chamber and one of the load lock chambers.

\* \* \* \* \*

UNITED STATES PATENT AND TRADEMARK OFFICE
CERTIFICATE OF CORRECTION

PATENT NO. : 6,250,869 B1
DATED : June 26, 2001
INVENTOR(S) : Tony R. Kroeker

It is certified that error appears in the above-identified patent and that said Letters Patent is hereby corrected as shown below:

<u>Title page,</u>
Related U.S. Application Data, please replace "Division" with -- Continuation --.
ABSTRACT,
Line 9, please replace "semi-cylindcical" with -- semi-cylindrical --.

<u>Column 1,</u>
Line 52, please replace "fist" with -- first --.

<u>Column 5,</u>
Line 9, please delete "is" after "within".
Line 34, please replace "m m g" with -- minimizing --.

<u>Column 6,</u>
Line 43, please replace "42" with -- 82 --.

<u>Column 7,</u>
Line 67, please replace "evacuate&" with -- evacuated. --.

<u>Column 8,</u>
Line 39, please delete "25".

<u>Column 9,</u>
Line 11, please replace "herein" with -- wherein --.
Line 27, please replace "disused" with -- disposed --.

UNITED STATES PATENT AND TRADEMARK OFFICE
CERTIFICATE OF CORRECTION

PATENT NO. : 6,250,869 B1
DATED : June 26, 2001
INVENTOR(S) : Tony R. Kroeker

It is certified that error appears in the above-identified patent and that said Letters Patent is hereby corrected as shown below:

Column 10,
Line 11, please replace "collected" with -- connected --.

Signed and Sealed this

Eleventh Day of June, 2002

Attest:

Attesting Officer

JAMES E. ROGAN
Director of the United States Patent and Trademark Office